United States Patent
Carr et al.

(10) Patent No.: US 6,442,307 B1
(45) Date of Patent: Aug. 27, 2002

(54) SOLDER-PACKAGED OPTICAL MEMS DEVICE AND METHOD FOR MAKING THE SAME

(75) Inventors: Dustin W. Carr, Pittstown; Dennis S. Greywall, Whitehouse Station; Sungho Jin, Millington; Flavio Pardo, New Providence; Hyongsok Soh, Basking Ridge, all of NJ (US)

(73) Assignees: Lucent Technologies Inc., Murray Hill, NJ (US); Agere Systems Guardian Corp., Orlando, FL (US)

( * ) Notice: Subject to any disclaimer, the term of this patent is extended or adjusted under 35 U.S.C. 154(b) by 68 days.

(21) Appl. No.: 09/705,350

(22) Filed: Nov. 3, 2000

(51) Int. Cl.⁷ .................................................. G02B 6/26
(52) U.S. Cl. ............................ 385/18; 385/14; 359/245
(58) Field of Search ....................... 385/14, 18; 359/245

(56) References Cited

U.S. PATENT DOCUMENTS

| | | | | |
|---|---|---|---|---|
| 5,444,520 A | * | 8/1995 | Murano | 347/244 |
| 6,002,507 A | * | 12/1999 | Floyd et al. | 359/201 |
| 6,201,631 B1 | * | 3/2001 | Greywall | 335/222 |
| 6,351,577 B1 | * | 2/2002 | Aksyuk et al. | 372/20 |

* cited by examiner

Primary Examiner—Robert H. Kim
Assistant Examiner—George Wang

(57) ABSTRACT

In accordance with the invention, a MEMs mirror device comprises a mirror layer including a frame structure and at least one mirror movably coupled to the frame and an actuator layer including at least one conductive path and at least one electrode for moving the mirror. The mirror layer and the actuator layer are provided with metallization pads and are bonded together in lateral alignment and with predetermined vertical gap spacing by solder bonds between the pads. The device has utility in optical cross connection, variable attenuation and power gain equalization.

32 Claims, 12 Drawing Sheets

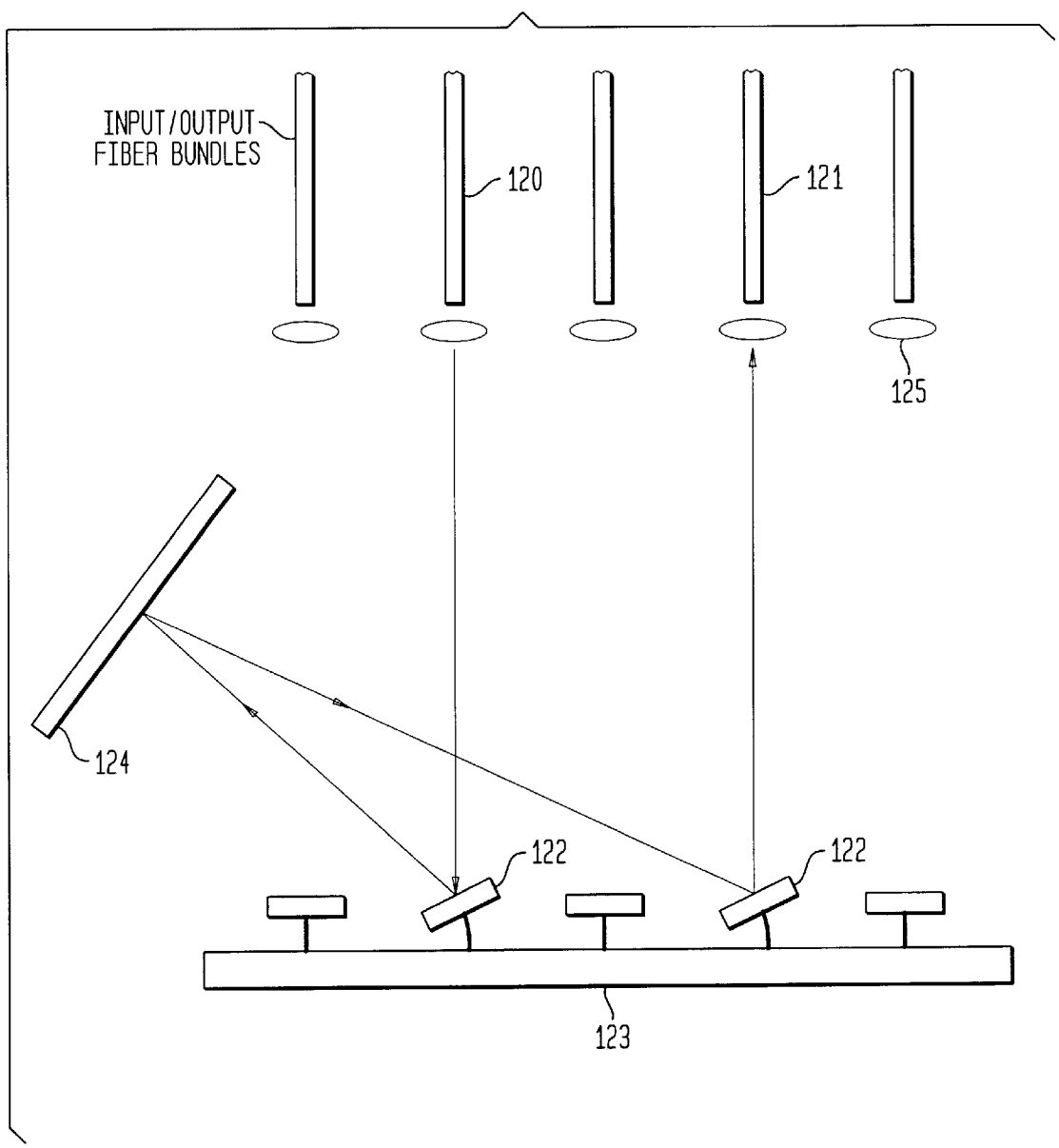

SOLDER-PACKAGED OPTICAL MEMS DEVICE AND METHOD FOR MAKING THE SAME

FIELD OF THE INVENTION

The present invention relates to optical micro-electro-mechanical devices ("MEMs devices") and, in particular, to MEMs devices constructed using solder bond assembly. The inventive MEMs devices are particularly useful as movable mirrors in optical communication systems.

BACKGROUND OF THE INVENTION

Optical MEMs devices are of considerable importance in optical communication systems. In one important application, a two-dimensional array of MEMs devices is used to provide an optical cross connect between input optical fibers and output optical fibers. Each MEMs device in the array is a movable mirror disposed to receive the optical signal from an input fiber. The mirror can be electrically moved to reflect the received optical input to a desired output fiber.

A typical MEMs mirror comprises a metal-coated silicon mirror movably coupled to a surrounding silicon frame via a gimbal. Two torsional members on opposite sides of the mirror connect the mirror to the gimbal and define the mirror's axis of rotation. The gimbal, in turn, is coupled to the surrounding silicon frame via two torsional members defining a second axis of rotation orthogonal to that of the mirror. A light beam can therefore be steered in any direction.

Electrodes are disposed in a cavity underlying the mirror and the gimbal. Voltages applied between the mirror and an underlying electrode and between the gimbal and an electrode control the orientation of the mirror. Alternatively, in slightly modified arrangements, an electrical signal can control the position of the mirror magnetically or piezoelectrically.

FIGS. 1(a) and 1(b) illustrate conventional optical MEMs devices and their application. FIG. 1(a) shows a typical prior art optical MEMs mirror structure. The device comprises a mirror 10 coupled to a gimbal 11 on a polysilicon frame 12. The components are fabricated on a substrate (not shown) by micromachining processes such as multilayer deposition and selective etching. After etching, mirror assembly (10, 11, 12) is raised above the substrate by upward bending lift arms 13 during a release process. The mirror 10 in this example is double-gimbal cantilevered and attached onto the frame structure 12 by springs 14. The mirrors can be tilted to any desired orientation for optical signal routing via electrostatic or other actuation with electrical voltage or current supplied from outside. The light-reflecting surface of mirror 10 comprises a metal coated polysilicon membrane which is typically of circular shape. The metal layers are deposited by known thin film deposition methods such as evaporation, sputtering, electrochemical deposition, or chemical vapor deposition.

FIG. 1(b) schematically illustrates an important application of optical MEMs mirrors as controllable mirror arrays for optical signal routing. The cross connect system shown here comprises optical input fibers 120, optical output fibers 121 and an array of MEMs mirrors 122 on a substrate 123. The optical signals from the input fibers 120 are incident on aligned mirrors 122. The mirrors 122, with the aid of a fixed auxilliary mirror 124 and appropriate imaging lenses 125, are electrically controlled to reflect the incident optical signals to respective output fibers 121. In alternative schemes, the input fibers and the output fibers are in separate arrays, and a pair of MEMs mirror arrays are used to perform the cross connect function.

The tilting of each mirror is controlled by applying specific electric fields to one or more of the electrodes (not shown) beneath the mirror. Undesirable variations in the gap spacing between the mirror layer and the electrode layer, symmetric or nonsymmetric, alter the electric field for the applied field, which affects the degree of electrostatic actuation and hence the degree of mirror tilting. This in turn alters the path or coherency of light signals reaching the receiving fibers, thus increasing the signal loss during beam steering.

An array of such MEMs mirrors is essentially composed of two layers: a mirror layer comprising the array of mirror elements movably coupled to a surrounding frame and an actuator layer comprising the electrodes and conductive paths needed for electrical control of the mirrors. One approach to fabricating the array is to fabricate the actuator layer and the mirror layer as successive layers on the same workpiece and then to lift up the mirror layer above the actuator layer using vertical thermal actuators or stresses in thin films. This lift-up process is described in U.S. patent application Ser. No. 09/415,178 filed by V. A. Aksyuk et al. on Nov. 8, 1999 and assigned to applicant's assignee.

An alternative approach is to fabricate the mirror layer on one substrate, the actuator layer on a separate substrate and then to assemble the mating parts with accurate alignment and spacing. The two-part assembly process is described in U.S. Pat. No. 5,629,790 issued to Neukermans et al. on May 13, 1997 and U.S. patent application Ser. No. 09/559,216 filed by Greywall on Apr. 26, 2000, both of which are incorporated herein by reference. This two-part assembly provides a more robust structure, greater mirror packing density and permits larger mirror sizes and rotation angles as well as scalability to larger arrays.

In the two-part assembly process, the mirror layer-and the actuator layer should be bonded for mechanical sturdiness and long-term reliability. Neukermans et al. and Greywall suggest anodic bonding, solder glass bonding, and epoxy bonding. The gap spacing between the mirror layer and the actuator layer determines the electric field for the given magnitude of applied voltage (or the magnetic field for the given electrical current level). Therefore, an accurate and reliable establishment of the gap spacing during the assembly and bonding of the two parts, as well as the dimensional stability of the gap during device handling, shipping and operation are important. The accurate lateral alignment of the mating parts of the mirrors and electrodes is also desirable for reliable operation.

SUMMARY OF THE INVENTION

In accordance with the invention, a MEMs mirror device comprises a mirror layer including a frame structure and at least one mirror movably coupled to the frame and an actuator layer including at least one conductive path and at least one electrode for moving the mirror. The mirror layer and the actuator layer are provided with metallization pads and are bonded together in lateral alignment and with predetermined vertical gap spacing by solder bonds between the pads. The device has utility in optical cross connection, variable attenuation and power gain equalization.

BRIEF DESCRIPTION OF THE DRAWINGS

The nature, advantages and various additional features of the invention will appear more fully upon consideration of the illustrative embodiments now to be described in detail with the accompanying drawings. In the drawings:

FIGS. 1(a) and 1(b) illustrate conventional MEMs devices and their application;

It is to be understood that the drawings are for purposes of illustrating the concepts of the invention and are not to scale.

DETAILED DESCRIPTION OF THE INVENTION

Figure 2A:
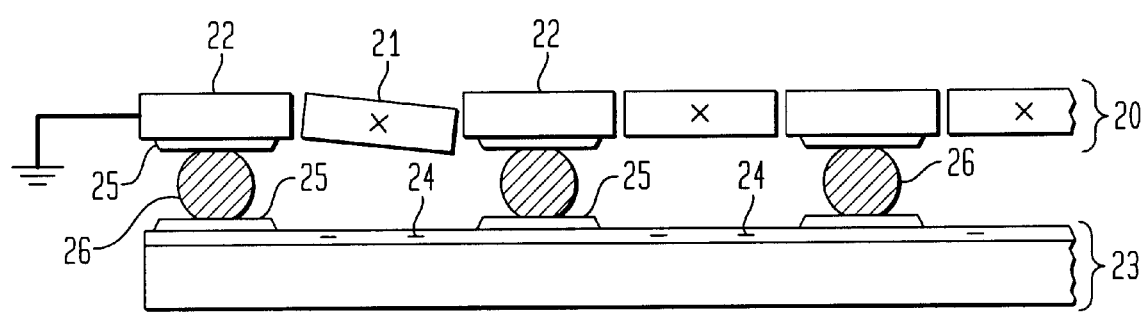
FIGS. 2(a) and 2(b) schematically illustrate a first embodiment of a MEMs device in accordance with the invention.

Referring to the drawings, FIG. 2(a) illustrates an exemplary optical MEMs device in accordance with the invention comprising a mirror layer 20 including at least one gimballed mirror 21 movably coupled to the surrounding frame 22 and a mating actuator layer 23 including at least one actuating electrode 24 and leads (not shown) for applying voltage between electrode 24 and gimballed mirror 21.

Layers 20 and 23 are advantageously polysilicon or single crystal silicon. The mating surfaces of the layers are each provided with a plurality of wettable metallization regions 25 and solder ball bonds 26 between metallization regions 25. The layers are spaced apart by the solder balls 26. The gimballed mirror 21 can be a double-gimballed, cantilevered mirror and is coupled to the frame structure 22 of layer 20 by torsion bars or springs (not shown). Hence the mirror 21 can be tilted to any desired orientation.

Each mirror 21 can be electrically grounded and tilted for optical signal routing via electrostatic actuation by one or more electrodes 24 placed underneath the mirror. An exemplary desired size (effective diameter) of mirrors suitable for optical MEMs applications is in the range of 50–10000 μm, preferably in the range of 200–2000 μm. The mirrors can be coated with a reflecting metal layer comprising Au, Ag or Al. The use of other metals or alloys is not precluded.

The mirror layer 20 and the actuator layer 21 are solder bonded together with accurate lateral alignment and with accurate gap spacing. The mirror layer 20 typically comprises an array of mirrors 21. The two-part structure is conveniently fabricated using a single-crystal silicon wafer fabrication process, although a polysilicon surface micromachining can also be used for providing the separate mirror and the electrode parts. See the aforementioned U.S. patent application Ser. No. 09/559,216 to Greywall.

Figure 2B:
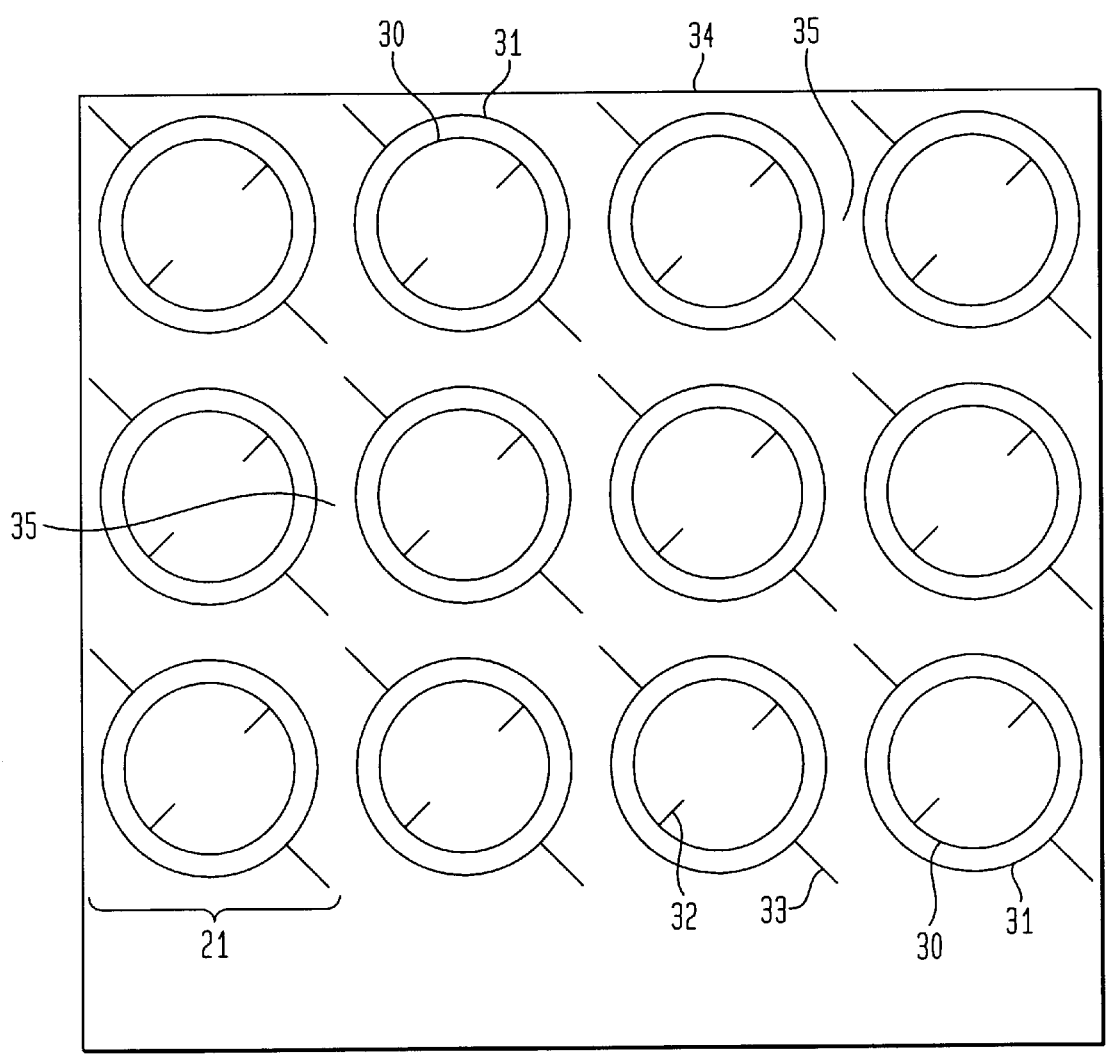

FIG. 2(b) illustrates a two-dimensional array of such movable gimballed mirrors 21. The mirror elements 30 are attached to gimballs 31 by torsion bars 32. The gimballs, in turn, are attached by torsion bars 33 to a frame 34 The mirrors can be patterned on a single layer of substrate, for example, an SOI (silicon-on-insulator) single crystal silicon wafer using conventional silicon fabrication processes such as lithographic patterning, chemical etching, or reactive ion etching. The open areas 35 between the gimballed mirrors can be utilized to place solder bonds as shown in FIG. 2(a).

This solder bonded MEMs device has many processing and performance advantages as compared with conventional devices. The solder bonding, as shown herein, can provide highly accurate spacing of the gap between the layers 20, 23 and facilitate highly accurate lateral alignment. Such a structure permits precise control of the mirrors, a more robust structure, greater packing density, larger mirror sizes, and larger mirror rotation angles than are conventionally obtained and easier electrical connection to the mirrors.

Figure 3A:
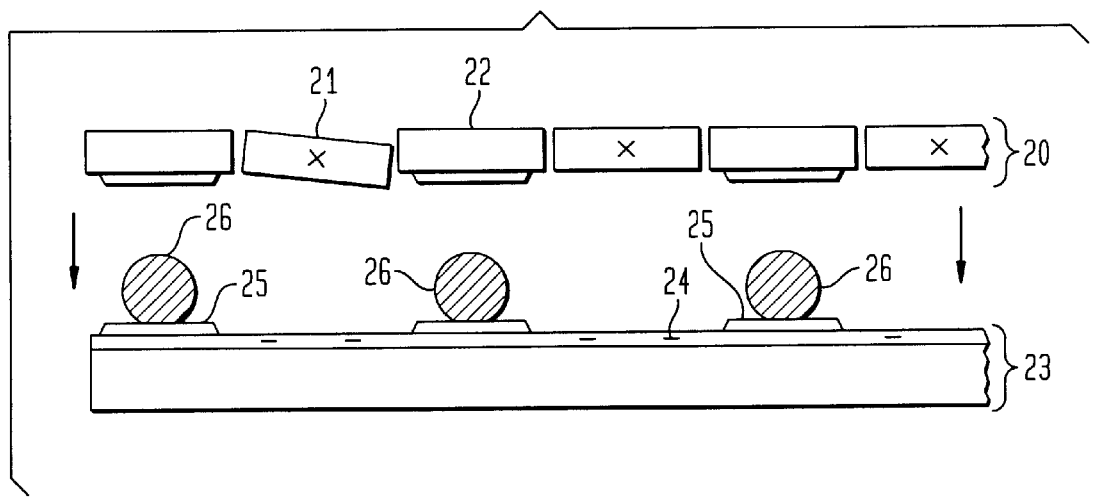
FIGS. 3(a) and 3(b) illustrate steps in a first method of fabricating the FIG. 2 device.
Figure 3B:
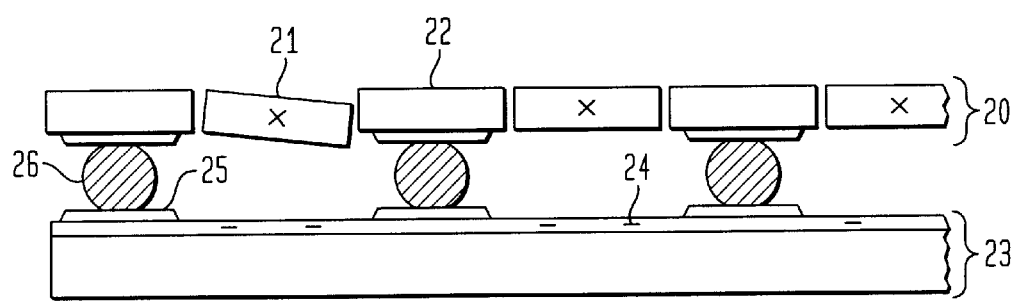

FIGS. 3(a) and 3(b) illustrate steps in assembly of the optical MEMS device shown in FIG. 2(a). The mirror layer 20 and the actuator layer 23 can be accurately laterally aligned, e.g., by using a micro aligner (not shown) for x-y positioning. The vertical gap can be accurately controlled, e.g., by using a z-axis position sensor and micro-positioner (not shown), optionally guided by camera vision sensor, or capacitive gap sensor. The solder bonding operation may be carried out while the pre-aligned lateral and vertical positions are held in position until the solder solidification is completed. The thermal contraction of solder joint height is desirably considered in determining the z-axis gap positioning.

The layers 20, 23 are typically comprised of solder non-wettable surfaces such as silicon, silicon oxide. In order to make these surfaces solderable, underbump metallization (UBM) coatings 25 are desirable. The UBM layers for the optical MEMS assembly advantageously comprise at least one adhesion layer such as Ti or Cr with an optional Cr—Cu gradient alloy layer, at least one solderable metal layer such as Cu or Ni, and at least one surface oxidation-resistant layer such as Au, Pd, Pt or Ag. The use of one or more diffusion barrier layers to prevent or minimize undesirable inter-layer metallurgical reactions is not precluded.

The preferred thickness of the adhesion layer is in the range of 2–500 nm, preferably 20–200 nm. The preferred thickness of the solderable layer is in the range of 50–5000 nm, preferably 100–1000 nm. The desired thickness of the oxidation-resistant protective layer is in the range of 10–500 nm, preferably 20–200 nm. The UBM coatings 25 are typically applied to the surfaces of both the mirror layer and the actuation layer facing each other, at locations between the mirrors, Patterning of the UBM coating 25 can be done using known techniques such as lithography or deposition through shadow masks with desired pattern geometry.

The solder alloys may be applied onto the UBM surface as a paste, preform or deposited film, e.g., prepared by sputtering, evaporation, or electrodeposition. The solder material is then reflowed (melted by heating) so as to form well-defined, near-spherical solder balls 26 as shown in FIG. 3(a) solder bumps. Either the mirror layer, the actuator layer, or both contain these solder bumps.

The mirror and the actuator layers are brought together into contact and heated to produce solder joints and mechanically attach the two parts as shown in FIG. 3(b). A solder flux is optionally used to aid the soldering process. For the optical MEMS assembly, a vapor flux such as formic acid carried by nitrogen or argon gas is preferred over liquid flux which may get trapped in tiny gaps near the mirror or spring hinge structure. Examples of solder alloys suitable for the inventive assembly of the two-part optical MEMS devices include 37% Pb-63% Sn (by weight) eutectic solder (with a melting point (m.p.) of ~183° C.), high-lead 95Pb-5Sn solder (m.p. ~308° C.), Sn-3.5Ag (m.p. ~221° C.), 57Bi-43Sn (m.p. ~139° C.), 95Sn-5Sb (m.p. ~245° C.), 49Sn-51In (m.p. ~137° C.), and 80Au-20Sn (m.p. ~280° C.).

The gap spacing between the mirror layer 20 and the actuator layer 23 is important for reproducible actuation of the optical MEMs mirrors. As an alternative to mechanical positioning and soldering, the spacing may be controlled by careful selection of solder volume applied onto each UBM pad, the area of the pad, the weight applied over the top of the assembly during the soldering, and the temperature and time of soldering. Larger volume, smaller pad area, smaller weight applied, and lower soldering temperature tend to produce taller solder joints. The solder joints so produced typically exhibit a truncated sphere shape.

One may approximate the relation between vertical gap spacing and solder volume by assuming that the solder joint has the form of a sphere of radius R truncated at the planes of contact with the metallization pads. In an exemplary device we may assume that the diameter of the circle of contact (plane of truncation) is approximately the height of the joint, then the joint height h=$\sqrt{2}$R. The joint height h can then be correlated to the volume of the truncated solder (0.884×4/3πR$^3$) with a ratio $\sqrt{2}$R/(3.701R$^3$). Thus by controlling the volume of the solder on the metallization pads, the joint height can be controlled. The soldering process onto mating pad areas has a self aligning effect due to the surface tension of molten solder and the driving force to reduce the surface energy of the molten solder at the joint. The mirror layer above and the actuator layer below are thus pulled together while the mating pads are automatically laterally aligned. For even more accurate lateral alignment, supplemental mechanical alignment may optionally be employed, e.g., by utilizing alignment of notches, edges or corners against fixed-positioned notches or steps in the assembly.

The attainable accuracy in the vertical gap spacing in the inventive solder assembly is with less than ±10% variation from the preferred nominal spacing, preferably with less than ±5% variation, and even more preferably with less than ±2.5% variation. For example, 600 μm diameter mirrors may operate with a mirror-electrode spacing of 60 μm. The attainable variation from this 60 μm spacing is less than ±6 μm, preferable less than ±3 μm, even more preferably less than ±1.5 μm. The lateral alignment of mirror position vs electrode position is also critical as a deviation from desired alignment may lead to an undesirable deviation in the intensity of electrostatic (or magnetic) actuation of the MEMS device. The attainable lateral alignment in the inventive, solder-packaged optical MEMS device is with an accuracy of within ±5%, preferably within ±1% of the effective mirror diameter. The effective mirror diameter of a non-circular mirror is the diameter of a circle having the same area as the mirror.

Figure 4A:
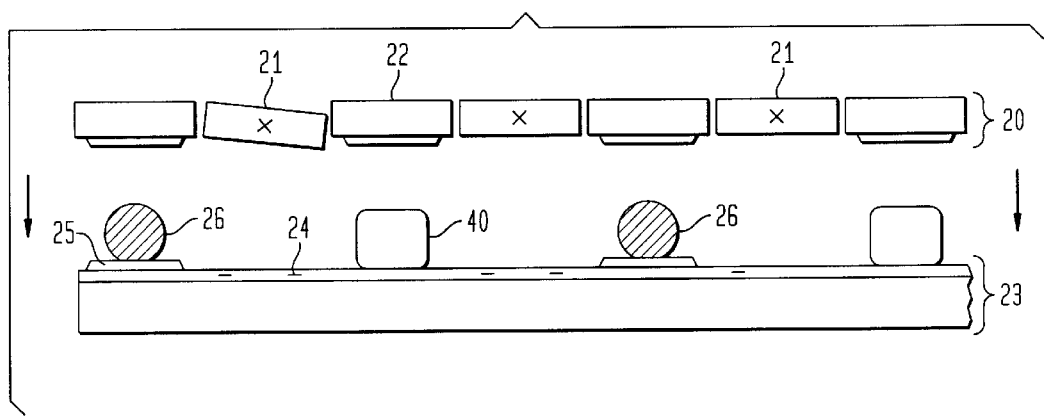
FIGS. 4(a), 4(b) and 4(c) illustrate steps in a second method of fabricating the device using a removable spacer.
Figure 4B:
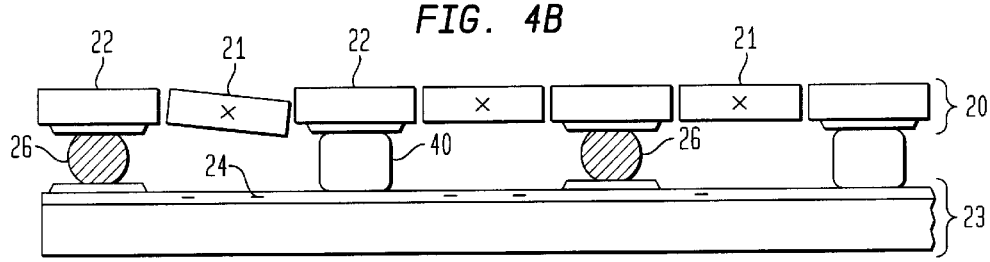
Figure 4C:
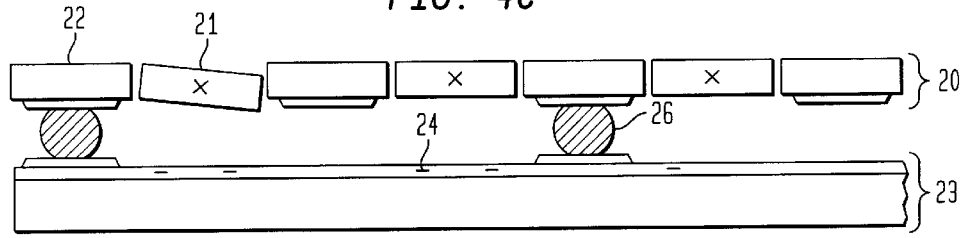

FIGS. 4(a), 4(b) and 4(c) schematically illustrate the use of a removable spacer 40 to further enhance the accuracy of the gap spacing in a solder-assembled, two-part optical MEMS device. With spacer 40, an accuracy of within ±5%, preferably within ±2.5% of a desired gap spacing can be obtained. In FIG. 4(a), the UBMs and solder bumps are provided on selected sites of between-mirror spaces with certain regular or irregular intervals. A removable spacer assembly is prepared with a pre-determined height (or thickness), desirably with less than ±1% and preferably with less than ±0.5% deviation from the target spacing.

FIG. 4(b) shows the mirror layer 20 laterally aligned with the actuator layer 23 and placed on the movable spacers 40 to provide accurate vertical spacing. The assembly is then heated to solder the layers 20, 23 together.

After soldering, the removable spacers 40 are removed (physically or by etching), leaving the structure shown in FIG. 4(c).

Figure 5A:
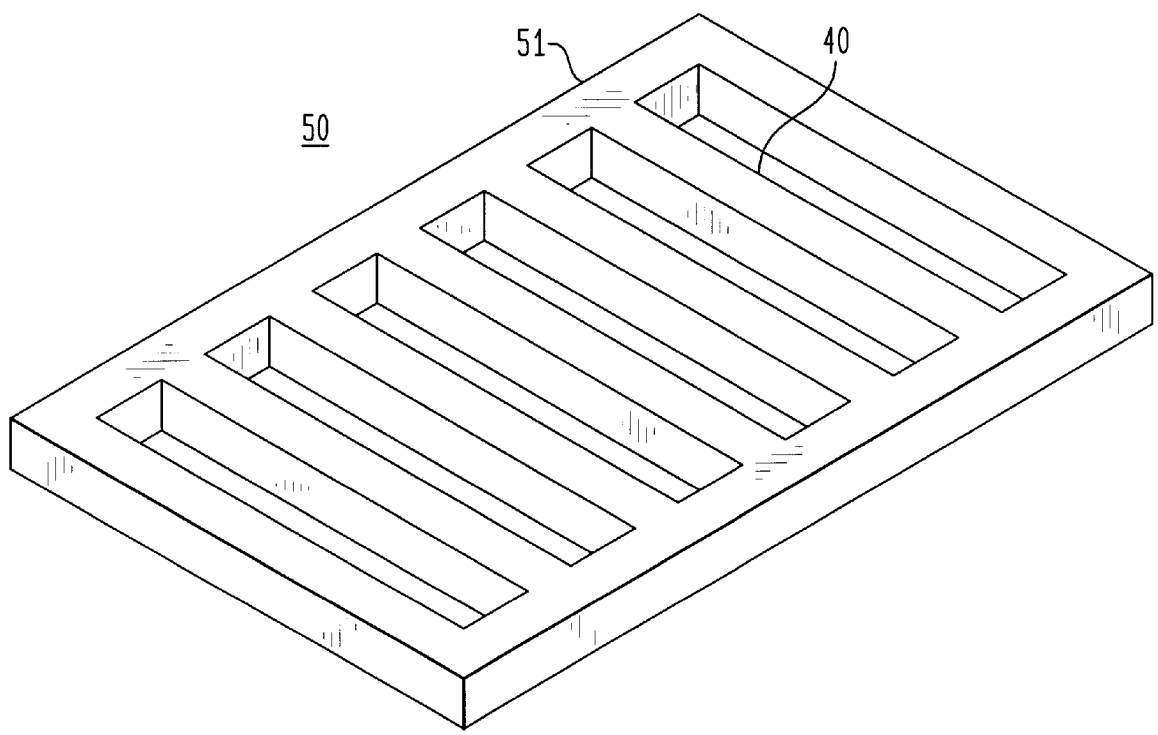
FIGS. 5(a) and 5(b) illustrate exemplary, removable spacers suitable for solder bond height control.
Figure 5B:
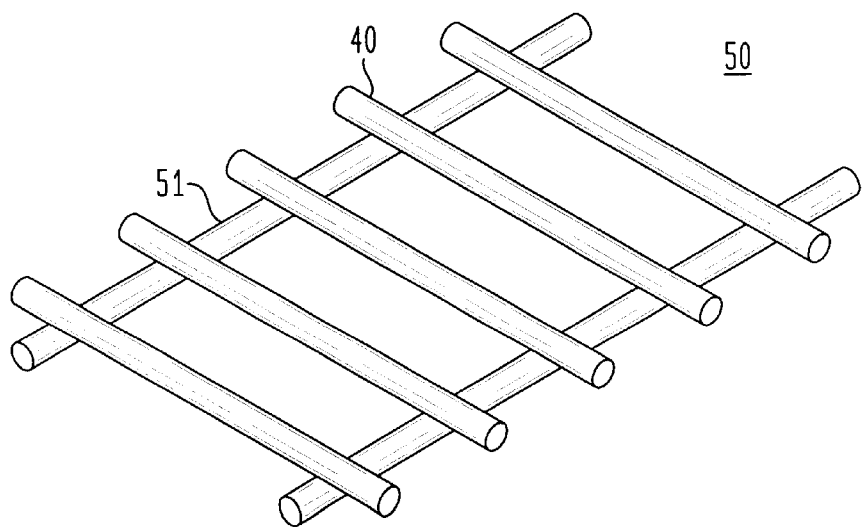

The removable spacer is preferably an assembly 50 of a periodic and parallel array of spacers 40. FIGS. 5(a) and 5(b) illustrate exemplary assemblies 50 with connecting ends 51. With such assemblies, a connecting end 51 can be cut and using the other connecting end, the spacers 40 can be pulled out in a linear fashion without disturbing any of the mechanically fragile mirrors.

The spacer assembly 50 is placed over the actuator layer 23 which already contains solder bumps at specific sites. The location of each of the spacers 40 is selected in such a way that they do not overlap with the existing solder bumps. The mirror layer 20 is then placed above the removable spacer assembly, laterally aligned with respect to the actuator layer. Then the entire assembly is heated and solder bonded while a weight or pressure is optionally being applied so that the solder height turns out to be exactly the same as the spacer height. Even in the absence of the applied pressure, the solder surface tension can be utilized to vertically pull the mirror and the electrode layer closer until they both touch the removable spacer.

After the soldering operation, one edge of the spacer assembly is cut off, and the spacers are mechanically pulled out, leaving the final configuration of FIG. 4(c). Alternatively, although less preferable, the spacers can be chemically etched away or burned away if the spacer material is chosen such that the etching or burning process does not damage the mirror and associated components.

Solder alloys generally exhibit very high coeffecient of thermal expansion (CTE), especially those containing a large percentage of Pb or In. The CTE values of solder alloys can be as high as 23–28×10$^{-6}$/degree C as compared to ~4×10$^{-6}$/degree C for Si, ~13×10$^{-6}$/degree C for nickel, and ~18×10$^{-6}$/degree C for copper alloys. If the spacers of FIG. 4 have a much lower CTE value than the solder contracts, then the spacers advantageously should be removed after the soldering operation is completed. Repeated changes in temperature environment during service, storage or shipping of the packaged optical MEMS devices might otherwise result in a premature fatigue failure of the solder joints.

The solidification shrinkage combined with the generally greater thermal contraction of the solder joint material as compared to the thermal contraction of the spacer material may result in a trapping of the spacer. In order to allow an easy removal of the spacer by horizontal pull out without seriously disturbing or damaging the delicate mirror and associated structures, one or more of the following approaches can be utilized.

1. The spacer can be made up of round or oval crosssectioned wires with minimal contact with the upper mirror layer and the lower electrode layer, and be coated with low-friction-coeffecient material such as a fluorocarbon, a diamond or diamond-like-carbon film so that the mechanical pulling out of the spacer becomes easier.

2. The spacer can be made of a round tube material with a hollow core instead of solid wire material so that the spacer material has some vertical compliancy and is more easily removed by horizontal pulling.

3. The spacer can be made of fine metallic tubes with a round or preferably an oval crosssection into which finer, round wires are inserted. When the soldering operation is completed, the inner round wires are pulled out first, which will then make the tube collapse into an oval shape with less height than the solder joint height. This allows easy removal of the remaining spacer frame material.

4. The material used for the spacer can be selected so that it has higher CTE value than the solder material used, and of course substantially higher melting point than that for the solder. On cooling to room temperature (or to even below room temperature if necessary) after soldering operation, the spacer then thermally contracts more than the solder joint height, loosens, and is easily removed. The desired CTE value for such thermal-contraction-removable spacer material is at least 10% higher, preferably at least 25% higher than the CTE of the particular solder used for the packaging. For example, an aluminum based alloy spacer with a CTE of $\sim 23 \times 10^{-6}$/degree C can be utilized if the solder used is 57% Bi—43% Sn eutectic solder with the CTE of $\sim 17.5 \times 10^{-6}$/degree C, a magnesium-based alloy spacer with CTE values of $\sim 26 \times 10^{-6}$/degree C can be utilized if the solder used is Sn-3.5% Ag eutectic with a CTE of $23 \times 10^{-6}$/degree C, and a Zn-1% Cu alloy spacer with a CTE of $\sim 35 \times 10^{-6}$/degree C may be utilized if 37Pb-63Sn eutectic solder with a CTE of $\sim 25 \times 10^{-6}$/degree C is used. The Bi—Sn solders with high Bi contents have a unique and advantageous behavior of expanding upon solidifacation thus making the removal of the spacer easier. The desired high CTE spacer material does not have to be restricted to metallic materials. For example, a spacer of the type shown in FIG. 5($a$) or 5($b$) may be made of a polyimide, thermosetting epoxy or other plastic material which remains stable at the typical soldering temperature of 100–300° C., and exhibit high CTE of often greater than $50 \times 10^{-6}$/degree C and consequently a large thermal contraction, thus allowing easy removal of the spacer after soldering operation. 5. The spacer can be made of a shape memory alloy such as the equiatomic Ni—Ti alloy, and alloys in general which undergo phase transformation and associated volume change near room temperature heating and cooling. The crosssection of the wire part of the shape memory spacer is made to have a collapsed oval shape at room temperature, which is converted to a taller crosssection by phase transformation when heated to the soldering temperature, which then returns to the original lower height when cooled back to room temperature. This allows easy removal from the solder-bonded optical MEMS package.

Figure 6A:
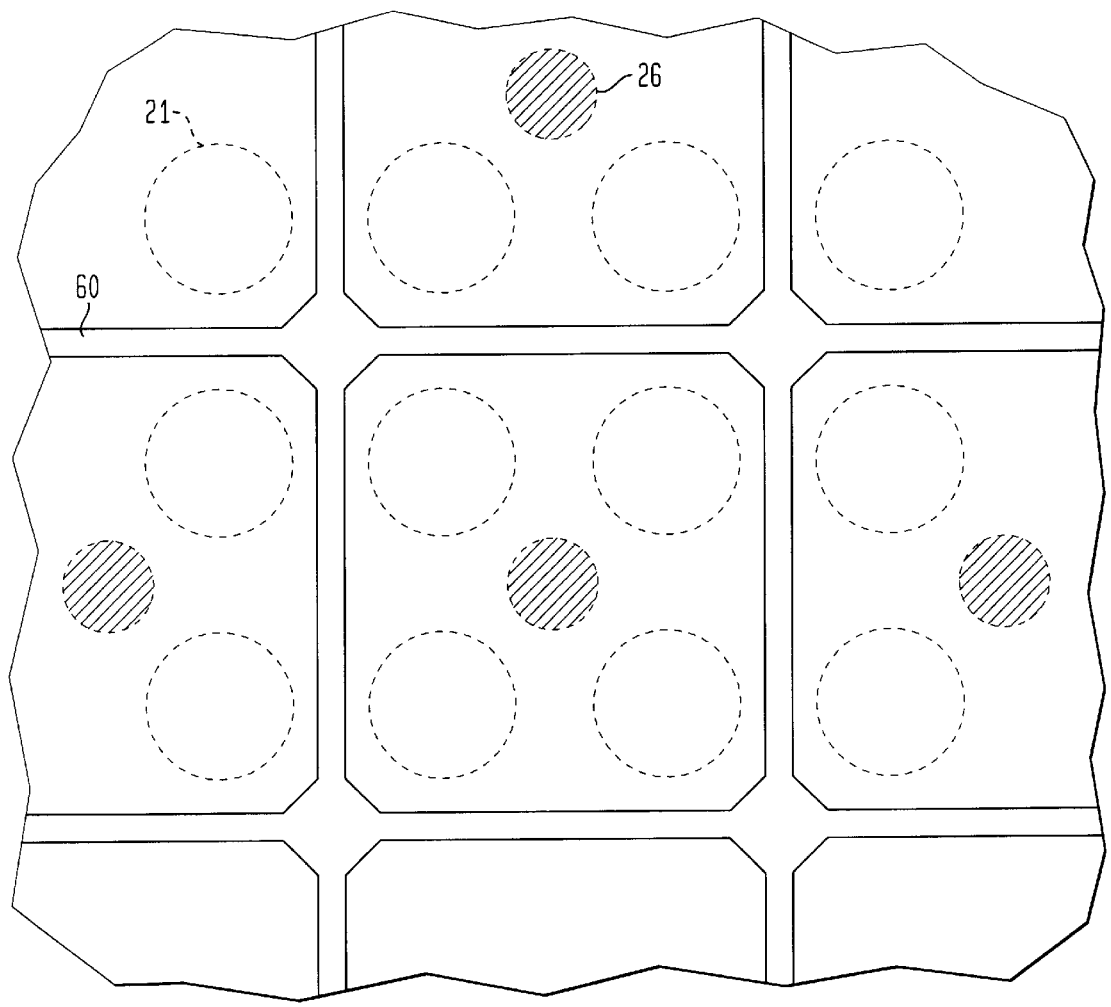
FIGS. 6(a) and 6(b) illustrate fabricating a MEMs device incorporating a permanent spacer.
Figure 6B:
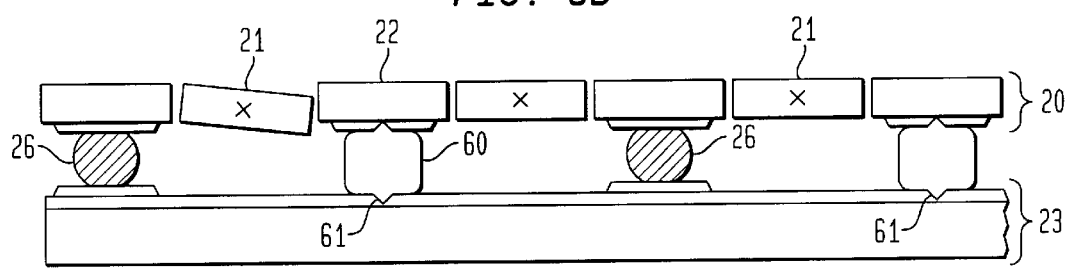

FIGS. 6($a$) and 6($b$) illustrate an alternative embodiment of the invention where the gap-defining spacer can be a permanent drop-in spacer 60 which is permanently left inside the solder-bonded optical MEMS package. In this case, the coefficients of thermal expansion (CTEs) of the spacer material and the solder material are carefully matched. Conveniently, the permanent spacer 60 is simply dropped-in into the gap and laterally aligned just prior to the soldering operation, and the spacer removal step can be omitted. Advantageously, the actuator layer 23 can be provided with notches 61 to facilitate lateral alignment of the spacer 60.

An important and preferred configuration of a drop-in (permanent) spacer 60 simultaneously incorporates aerodynamic isolation for of each mirror in the array. The movement of one mirror, for example, electrostatically actuated tilting for optical signal re-routing, can disturb or cause the movement of adjacent mirrors. The drop-in spacer is preferably configured so that the boundary area between adjacent mirrors is compartmented or blocked as much as possible. Blockage may be defined as the proportion of the 360° periphery underlying the mirrors that is blocked off by the spacer. The preferred blockage is on the average, with at least 20%, preferably 50%, even more preferably 80% of the total boundary wall area. After solidification of the bonding solder, the gap spacing between the mirror and the electrode layer is dictated by the pre-set thickness of the drop-in spacer. The relative adjustment of CTE values of the spacer and the solder by suitable materials selection in combination with the consideration of solidifacation shrinkage or expansion involved can be utilized to lock the spacer in place as shown in FIG. 6($b$), yet without excessive stresses, especially tensile stresses, induced into the solder joints.

A spacer useful for the structure of FIG. 6 can be made of elemental metals, alloys, ceramics, silicon or polymer. The CTE matching of the permanent drop-in spacer to that of the solder used is important in avoiding fatigue failure of solder joints on thermal cycling caused by ambient temperature changes or assembly/test process. In the inventive solder-packaged optical MEMS device, the CTE of the spacer material is preferably closely matched with that of the solder, with the difference being desirably less than ±20%, preferably less than ±10%, even more preferably less than ±5% of the solder CTE. For example, if the solder used is the 37Pb-63Sn eutectic solder with a CTE of $\sim 25 \times 10^{-6}$/degree C, the spacer material can be made of aluminum with a CTE of $23.6 \times 10^{-6}$/degree C or a magnesium alloy (Mg-9% Al-1% Zn) with a CTE of $26.1 \times 10^{-6}$/degree C. In general, alloy compositions containing Al, Zn, Mg, Pb, In, or Cu can be made to exhibit CTE values comparable to those of the commonly used solder alloys.

Alternatively, the spacer can be locked in place before the soldering operation by fixturing or attaching onto part of the overall device structure. FIG. 7($a$) illustrates an embodiment of the invention wherein a pre-attached spacer 70 is patterned and bonded onto one of the mating parts, e.g., either on the mirror layer or the actuator layer. These spacers are to be permanently left in the packaged structure. The pre-attached spacers 70 are desirably configured so that the boundary area between adjacent mirrors is compartmented or blocked as much as possible. The preferred blockage is on the average, with at least 20%, preferably 50%, even more preferably 80% of the total boundary wall area. The solder bumps are separately added for bonding purpose. The spacer thickness again accurately defines the gap spacing between the mirror and the electrode during the soldering operation. The preferred accuracy of these pre-attached spacers is within less than ±5%, more preferably less than ±2.5% deviation from the desired gap spacing. The pre-attached spacer 70 can be made of a metal, silicon, ceramic, polyimide or plastic material. Plastic materials tend to outgas in a hermetically sealed atmosphere, and also have generally higher CTE values, thus are less preferred than inorganic materials such as metals, ceramics or silicon materials.

In FIG. 7($a$), the mating faces of the mirror layer 20A and the actuator layer 23 are both in planar configuration, and the spacer is added after the mirror layer 20 with movable mirrors 21 is fabricated. The movable mirrors are preferably made of silicon, and is typically only several micrometers thick. In this embodiment the mirror layer 20A is fabricated on a silicon-on-insulator substrate comprising a first layer of silicon 71, a layer of $SiO_2$ 72 and a second layer of silicon 73. The thin silicon mirror can be made using the well-known silicon-on-insulator (SOI) fabrication process. The SOI process permits convenient fabrication of the thin silicon mirrors 21, and the presence of the buried oxide layer 72 is useful as an etch-stop barrier. In FIG. 7($a$), selected patterned areas of the upper portion 73 of the SOI substrate 20A are etched, e.g., by using chemical etch, reactive-ion etch, or a combination of these processes to form the mirror array. The gimbals and the torsion bars (not shown) are also formed around each mirror. The SOI material and process are described, for example, in *Concise Encyclopedia of Semiconducting Materials and Related Technologies*, Edited by S. Mahajan and L. C. Kimmerling, Pergamon Press, New York, 1992, p. 466.

Since the movable mirror is typically thin and fragile with about 1-10 micrometer thickness for the ease of movement, the mirror layer substrate base (layer 71) which carries the mirrors and gimbals is advantageously made substantially thicker than the movable mirror membrane to provide mechanical stability to the structure. The desired thickness of the SOI substrate for MEMS mirror applications is typically in the range of 50–1000 micrometers and preferably 200–500 micrometers. In the exemplary embodiment of FIG. 7(a), the SOI material is etched in such a way that the patterned thicker portion of the mirror-carrying substrate (layer 71) is facing up, while the smooth surfaced portion (layer 73) is facing down toward the actuator layer 23. In this embodiment, the mirror is formed on the layer of silicon proximal the actuation layer 23.

Figure 7A:
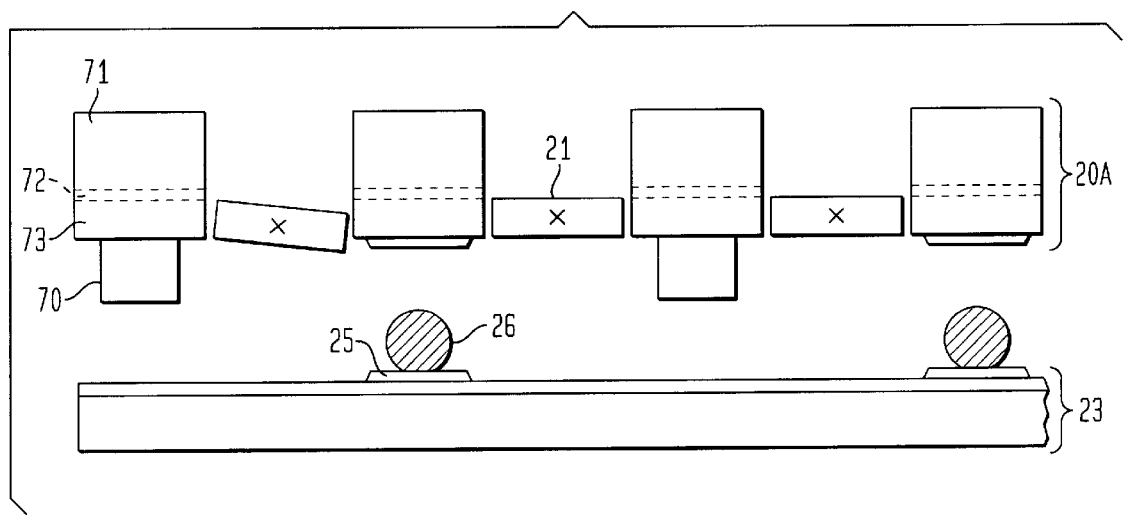
FIGS. 7(a) and (b) schematically illustrate two exemplary embodiments of the MEMS device according to the invention.
Figure 7B:
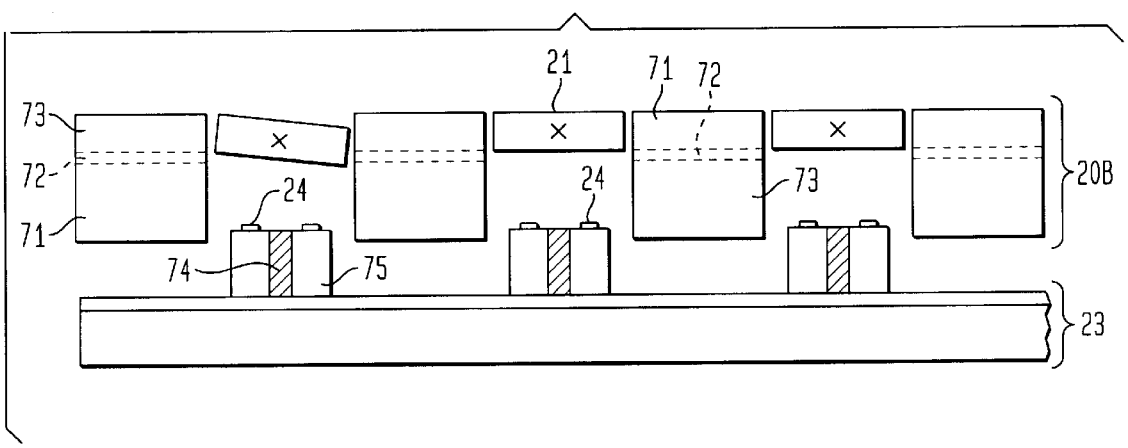

In an alternative embodiment illustrated in FIG. 7(b), the mirror-carrying SOI substrate 20B is turned upside-down so that the thicker portion 71 of the substrate 20B is conveniently utilized as an inherent (pre-existing) spacer. The mirror is formed on the layer of silicon distal from the actuation layer, and the layer of silicon proximal the actuation layer is configured to at least partially enclose the region underlying the mirror between the mirror and the actuation layer. Since the typically preferred thickness of the mirror-carrying substrate is at least 200 micrometers for mechanical sturdiness, this gap may be too large for easy, low-voltage actuation of the electrostatic operation of the MEMS mirrors. In order to overcome this complication, the actuator electrodes 24 are optionally raised, so that relatively low voltage operation are possible. Such desired elevation can be achieved by deposition of polysilicon, glass, metal or composite material base by chemical vapor deposition, physical vapor deposition, or electrochemical deposition.

One way of making such electrical connections to the raised electrodes is to use via holes 74 in combination with mesas 75 fabricated by silicon processing. The protruding mesa 75 can be made to fit into a cylindrical cavity that is part of the spacer wall structure. The vertical via holes 74 are metallized with metallic thin film deposition, polysilicon deposition, or with conductive polymer composite fillers. The via holes are electrically connected to underlying conducting electrical interconnection wires (usually thin film aluminum lines) which are connected to a power supply source (not shown).

Figure 8A:
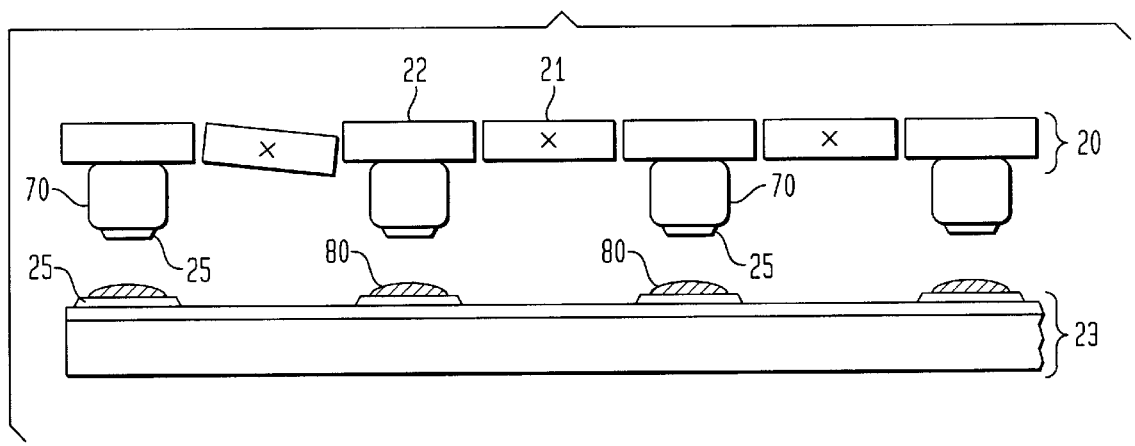
FIGS. 8(a) and 8(b) illustrate additional examples of MEMS devices using spacers.

The device of FIG. 7(b) is particularly useful for the following reasons: 1) enclosing spacer walls (regions 73) prevent or minimize the aerodynamic cross-talk of mirror operation, 2) the silicon proximal the actuation layer can be p-type or n-type doped, or coated with conducting material to reduce or eliminate electrostatic cross-talk and thereby shield the mirror, 3) since the upper surface of the mirror is flat with no protruding substrate portion, there is no significant anomalous light reflection from the corners or walls of protruding portions, 4) the required electrical grounding of the mirror layer and the spacer layer is easily done, and 5) the spacer can be easily bonded to the electrode layer either using solder joints (such as illustrated in FIG. 7(a)) replacing some of the inherent Si spacer protrusions (regions 71) with solder, or by using thin solder joints such as illustrated in FIG. 8(a).

Yet another alternative embodiment of using the inherent spacer as a part of the base MEMS structure is to produce the spacer on the actuator layer instead of the mirror layer. This can be accomplished by carrying out the silicon etch and patterning process on the electrode layer in such a way that a protruding silicon spacer of desired thickness, either as isolated islands or as a continuous wall, is present on the top surface of the electrode layer.

The use of electrically conducting spacers, e.g. made of metals or polysilicon, is important in avoiding electrostatic cross talk between neighboring mirrors, especially in high-density mirror array designs. In such devices where the adjacent mirrors are placed close to each other, the actuating electrostatic field from the electrodes can inadvertently affect the movement of the adjacent mirrors as the electric field applied can easily reach the edges of the neighboring mirrors or gimbals. In a preferred embodiment the spacers are made of highly conductive material so that they block the applied electric field from reaching the neighboring mirrors or gimbals. The desired electrical resistivity of the spacer material is less than 1 ohm.cm, preferably less than 1000 micro-ohm.cm, and even more preferably less than 100 micro-ohm.cm. It is further desirable to have the spacer essentially completely surrounding the cavity under the mirror so that the aerodynamic shielding and the electrostatic shielding is achieved simultaneously. The desired coverage of the wall area in the inventive combined aerodynamic/electrostatic shield is at least 20%, preferably at least 50%, even more preferably at least 90% of the total available boundary area between the adjacent mirror regions.

Metallic spacers such as Cu, Ni, Fe, Au, Pd, W and their alloys can be electroplated, evaporation deposited, or CVD (chemical vapor deposition) deposited, and are then patterned into a desired configuration. For electrodeposition, the selective sites on the surface of the substrate has to be made electrically conductive by metallization or electroless coating of conductive seed layer. Polysilicon spacers as thick as ~100 μm can be deposited, for example, by chemical vapor deposition process. The CTE mismatch between the spacer and the solder material should be kept in mind in designing and fabricating the optical MEMS solder packages. If the CTE mismatch is substantial, the temperature environment may have to more actively controlled so as to reduce the temperature excursion that the solder-packaged optical MEMS device experiences.

FIG. 8(a) illustrates an alternative embodiment utilizing the pre-attached spacer 70 but with minimized risk of CTE mismatch and associated reliability problems. This embodiment uses thin solder layer 80 placed directly under the spacer sites. Again the UBM coatings are needed on the mating surfaces. In this assembly approach, thin solder takes care of the bonding requirement while the spacer takes care of the gap spacing accuracy.

Figure 8B:
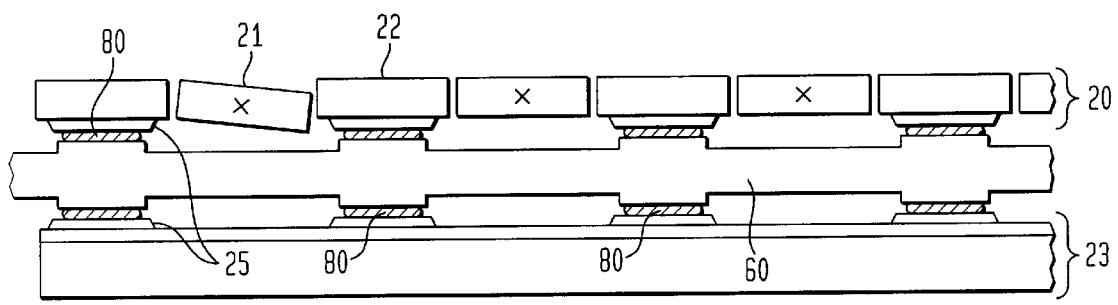

FIG. 8(b) illustrates another variation of assembly. Here, the thin solder region 80 is applied above as well as below a drop-in spacer 60. The thin solder can be pre-coated or pre-deposited either on the surfaces of the drop-in spacer or on the surface of the mirror layer or the actuator layer.

Yet another alternative embodiment of the pre-attached spacer is to make protruding features in the silicon substrate layer itself, e.g., by modifying the silicon wafer fabrication process for mirror and gimbal fabrication. For example, it is desirable to have the protruding silicon part present on the bottom of the mirror layer such as illustrated in FIG. 7 (or alternatively on the top of the actuator layer) and preferably also serve as aerodynamic separator as well. Therefor, the term "pre-attached spacer" as used herein is broadly used to include such protruding features.

The inventive solder-packaged optical MEMS device with accurate mirror-electrode spacing is useful as a reliable optical channel crossconnect for signal re-routing or signal modification in an optical communication system. In a crossconnect similar to FIG. 1(b), each mirror of a MEMs device described herein receives an optical signal from an input fiber and reflects it toward an intended output fiber.

Figure 9:
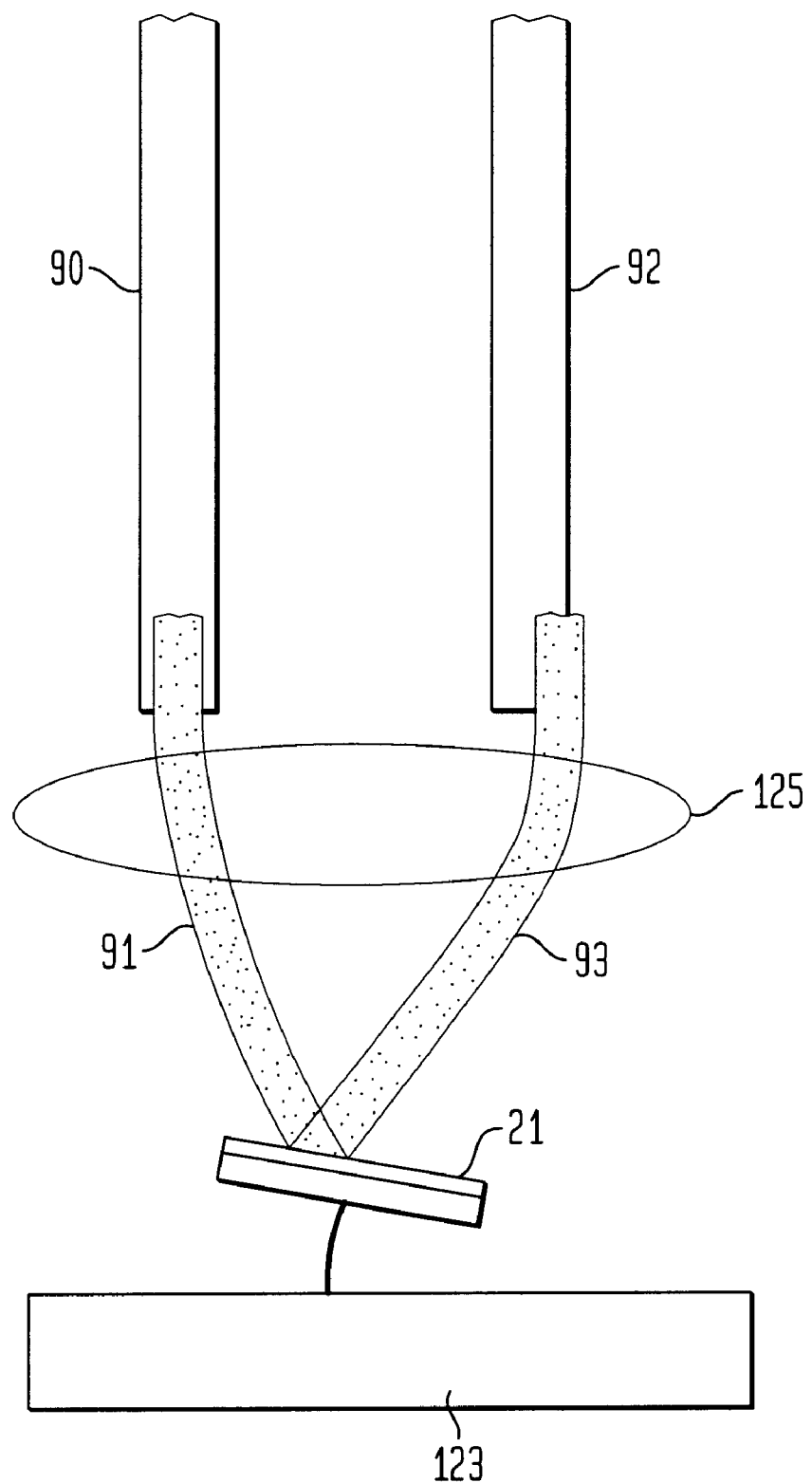
FIG. 9 schematically illustrates a variable attenuator comprising the optical MEMS structure according to the invention.

The inventive device is also useful for various other light-reflecting mirror systems such as power equalizers, variable attenuators, optical add/drop and switches. FIG. 9 illustrates a variable attenuator using the common principle upon which such systems are based. Assume that an input fiber 90 transmits an input signal 91 to be attenuated and sent to output fiber 92. Then controllable mirror 21 is positioned for receiving signal 91 and is oriented for reflecting the signal so that only a portion of the reflected signal 93 enters the output fiber 92. Fine control of the mirror orientation permitted by the accurate spacing and alignment of solder bonding assembly permits fine control of the degree of attenuation. Thus the solder-bonded devices and arrays described hereinabove can be used as variable attenuators, optical switches, add drop switches, and power equalizers.

Figure 1A:
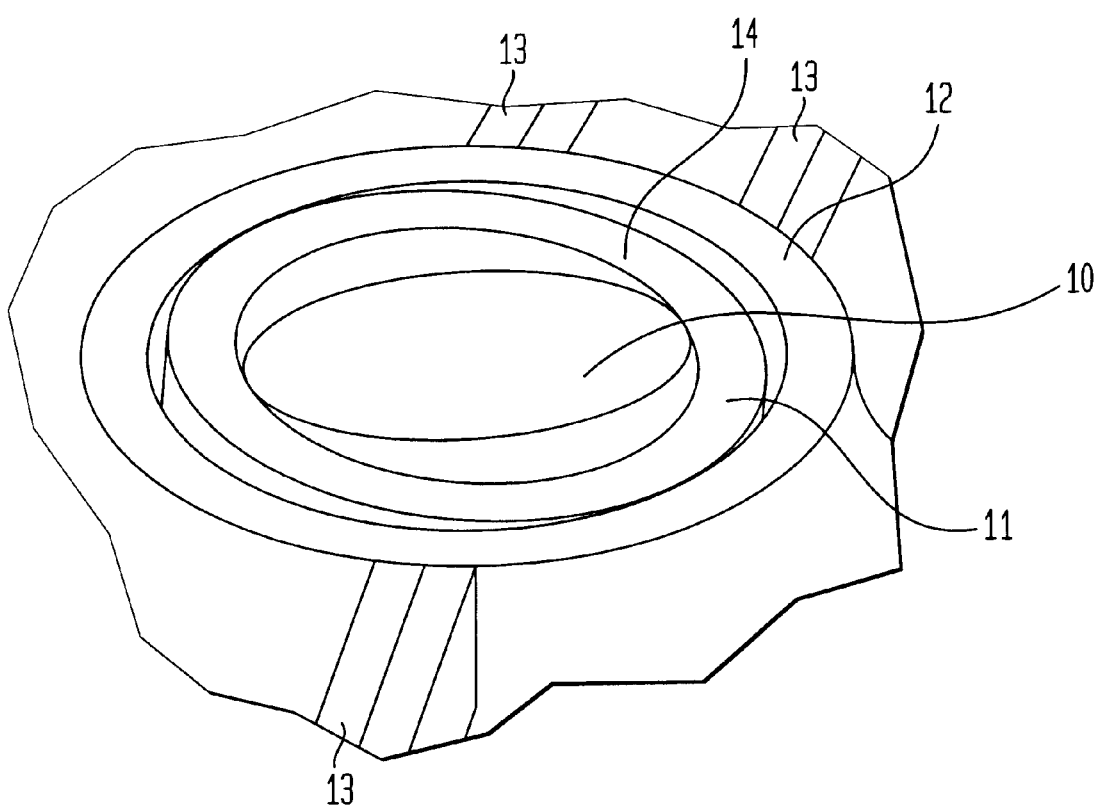

For a switch or an add/drop switch, in an arrangement similar to FIG. 1(b), the mirror for a channel to be switched off, dropped or rerouted is oriented to reflect the input signal to a different output fiber or to no output fiber, as desired. Hence the signal is rerouted, dropped or switched off. A channel is readily added to an output fiber by a mirror reoriented to reflect a new input to the output.

An important application relating to power equalization related to optical fiber amplified. By way of background, multi-wavelength optical communication systems require reconfiguration and reallocation of wavelengths among the various nodes of a network depending on user requirements, e.g., with programmable add/drop elements. One problem limiting the capacity of such systems is that the erbium-doped fiber amplifier, which is often a necessary component in optical communication systems, has a characteristic spectral dependence providing different gain for different wavelength channels. This spectral dependence poses a problem for multichannel WDM systems, because different gains for different channels leads to high bit error rates in some of the channels. As the number of channels passing through the amplifier changes by channel add/drop reconfiguration, the amplifier will start showing deleterious peaks in its gain spectrum at some wavelength channels, requiring modification of the signal spectrum and flattening of the amplifier gains.

A novel dynamic gain equalizer is based on MEMS optical devices with convenient and reliable solder packaging and improved accuracy of mirror-electrode spacing. The optical signal gain in each wavelength channel can be independently (and simultaneously with other channels) controlled by the MEMS optical mirror which reflects that particular signal. The mirrors in this case do not have to be tiltable in all orientations. A simple bending of a cantilever beam structure, desirably with a light-reflecting metal surface, can serve the purpose of gain equalizing. In addition, the mirrors do not have to be in circular shape. They can be square, rectangular, or of any elongated shape. The multiplexed optical is demultiplexed using suiable demultiplexers such as planar waveguides or thin film devices, with each of the separated wavelength channel signal being sent to each MEMS mirror and reflected. By programmably selecting the tilt (or bend) angle of relevant mirrors slightly off the angle of maximum signal reflection, the losses for various channels can be intentionally increased to different degrees for the purpose of gain equalizing. The stability of mirror operation enhanced by the inventive solder-packaged two-part optical MEMS devices is crucial in ensuring the accuracy of dynamic gain control by different mirrors.

Figure 10:
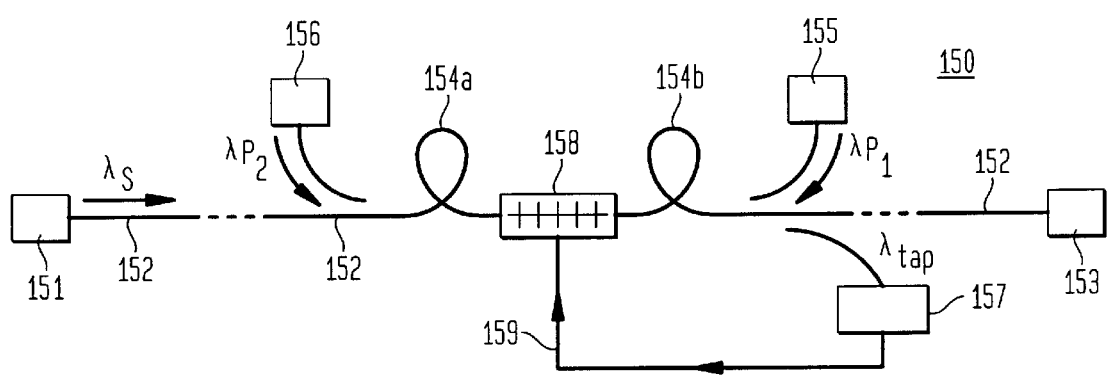
FIG. 10 schematically illustrates an optical communication system comprising a dynamic gain equalizer based on optical MEMS device according to the invention.

Referring to the drawings, FIG. 10 schematically illustrates an exemplary optical communication system a solder-packaged MEMS mirror structure as a gain equalizer. The system 150 comprises dynamically gain-equalized optical amplifiers, a reconfigurable MEMS mirror-type spectral shaping device, and a feedback device. Specifically, the system 150 comprises a transmitter source 151 of optical signals such as a digitally modulated 1.55 $\mu$m signal, an optical signal path comprising a length of optical fiber 152 for transmitting the signal, and a receiver 153 for receiving and demodulating the signal. One or more optical amplifiers, such as erbium-doped fiber amplifiers 154a, 154b, are disposed in the optical signal path for amplifying the transmitted signal. The amplifiers are pumped by pump sources 155, 156, of optical energy of pump wavelengths $\lambda_{p1}$ and $\lambda_{p2}$.

One of the preferred uses of the device of FIG. 10 is to reduce spectral dependence in the gain output of an optical amplifier. For example, the characteristic gain spectrum of an erbium-doped optical fiber amplifier has a pair of gain peaks at about 1.53 $\mu$m and at about 1.56 $\mu$m. Thus, a signal at 1.53 $\mu$m will be amplified more than one at 1.54 $\mu$m, which would be disadvantageous in a wavelength division multiplexing (WDM) system.

By properly demultiplexing the optical signal and sending to different light-reflecting mirrors for separately programmed attenuation of signal strengths, and by optional tuning of the mirror reflections via a feedback system, the gain spectrum of the amplifier device combination can be made substantially flat over a range of wavelengths. The tunable system 158 comprises a demultiplexer in combination with a tunable light-reflecting MEMS mirror device and a multiplexer to put together the different wavelength channels into the optical fiber. The device 158 is connected to a feedback system 159, having a wavelength detector 157 coupled to the fiber 152 for detecting the wavelength response $\lambda_{tap}$. The feedback system 159 automatically adjusts the tuning of the device 158 depending upon $\lambda_{tap}$. Advantageously, system 150 can be a WDM system using a plurality of different wavelength signals, e.g. $\lambda_{s1}$ and $\lambda_{s2}$, and a plurality of tunable MEMS mirror devices coupled to one or more detectors.

It is understood that the above-described embodiments are illustrative of only a few of the many possible specific embodiments which can represent applications of the invention. Numerous and varied other arrangements can be made by those skilled in the art without departing from the spirit and scope of the invention.

What is claimed is:

1. A micro-electro-mechanical device comprising:
    a mirror layer comprising a frame, at least one mirror and a plurality of solder wettable metallized regions, the mirror movably coupled to the frame;
    an actuation layer comprising at least one conductive path at least one electrode and a plurality of solder wettable metallized regions;
    the mirror layer and the actuation layer bonded together by solder joints between metallized regions on the respective layers with a gap spacing and in lateral alignment so that the movement of the mirror is controlled by an electrical signal applied to the electrode.

2. The device of claim 1 wherein the mirror layer comprises a plurality of mirrors disposed in an array and the actuation layer comprises a plurality of electrodes laterally aligned for controlling the movement of the plurality of mirrors.

3. The device of claim 1 wherein the actuation layer comprises a plurality of electrodes for controlling each mirror.

4. The device of claim 1 wherein the mirror is coupled to the frame via a movable gimbal.

5. The device of claim 1 wherein the vertical gap spacing between the mirror layer and actuation layer is within ±10% of a predetermined gap spacing and the lateral alignment is with an accuracy of ±5% of the mirror effective diameter.

6. The device of claim 5 wherein the vertical gap spacing between the mirror layer and actuation layer is within ±5% of a predetermined gap spacing and the lateral alignment is with an accuracy of ±1% of the mirror effective diameter.

7. The device of claim 1 wherein the mirror layer comprises silicon.

8. The device of claim 1 wherein the actuator layer comprises silicon.

9. The device of claim 1 wherein the mirror comprises a metal layer comprising Au, Ag, or Al.

10. The device of claim 1 further comprising one or more spacers between the mirror layer and the actuator layer to control the gap spacing between the layers.

11. The device of claim 10 wherein said one or more spacers is pre-attached to one of the mirror layer or the actuator layer and solder bonded to metallization pads on the other layer.

12. The device of claim 10 wherein said one or more spacers is solder bonded to metallization pads on the mirror layer and metallization pads on the actuator layer.

13. The device of claim 10 wherein the spacer comprises a metal, ceramic, silicon or polymer material.

14. The device of claim 1 further comprising at least one spacer between 1o the mirror layer and the actuator layer wherein the spacer extends around more than 20% of the boundary around the mirror for aerodynamic isolation.

15. The device of claim 10 wherein the CTE of the spacer differs by less than 20% from the CTE of the solder.

16. The device of claim 10 wherein the spacer is attached to either the mirror layer or the actuator layer.

17. The device of claim 10 wherein the spacer is a permanent spacer.

18. The device of claim 10 wherein the spacer is a drop-in permanent spacer which is vertically trapped by compressive stress caused by solder joint solidification and thermal contraction.

19. The device of claim 10 wherein the spacer is laterally aligned and constrained by an alignment notch.

20. A method of making an optical MEMs device comprising a mirror layer including at least one mirror movably coupled to the layer and an actuator layer including at least one conductive path and at least one electrode for moving the mirror, comprising the steps of:

a) forming a plurality of solder-wettable metallization pads on a surface of the mirror layer and on a mating surface of the actuator level, b) applying solder between metalization pads of the respective layers; and c) heating and bonding together the respective layers by forming solder joints of predetermined gap spacing between the metallization pads of the respective layers.

21. The method of claim 20 wherein the quantity of solder between metallization pads is chosen to provide the predetermined gap spacing.

22. The method of claim 20 further comprising the step of disposing a spacer between the layers to control the spacing between them.

23. The method of claim 22 wherein the spacer is removed after formation of the solder joints.

24. The method of claim 22 wherein the spacer is left between the layers after formation of the solder joints.

25. In an optical cross connect system comprising a plurality of input optical fibers, a plurality of input optical fibers, a plurality of output optical fibers and an optical MEMs device including a plurality of mirrors aligned for receiving optical signals from respective input fibers and reflecting the signals to respective output fibers, The improvement wherein the optical MEMs device is a device according to claim 1.

26. An optical variable attenuator comprising:
at least one input optical fiber;
at least one output optical fiber; and
at least one optical MEMs device according to claim 1, the device mirror aligned to receive an optical signal from the input fiber and to reflect a portion of the input signal to the output fiber, the size of the portion reflected to the output fiber chosen in accordance with the desired attenuation.

27. An optical power gain equalizer system comprising:
a plurality of input optical fibers;
a plurality of output optical fibers; and
at least one optical MEMs device according to claim 2, the mirrors of the array aligned to receive optical signals from respective input fibers and to reflect portions of the input signals to respective output fibers, the size of the respective portions chosen to equalize the respective output signals.

28. The device of claim 1 wherein the mirror layer comprises a composite layer of silicon, insulator and silicon.

29. The device of claim 28 wherein the mirror is formed on the layer of silicon proximal the actuation layer.

30. The device of claim 28 wherein the mirror is formed on the layer of silicon distal from the actuation.

31. The device of claim 30 wherein the layer of silicon proximal the actuation layer is configured to at least partially enclose the region underlying the mirror between the mirror and the actuation layer.

32. The device of claim 31 wherein the layer of silicon proximal the actuation layer is doped with impurities or coated with conductive material to provide electrostatic shielding of the mirror.

* * * * *